United States Patent
Funaki et al.

(10) Patent No.: US 7,583,149 B2
(45) Date of Patent: Sep. 1, 2009

(54) POWER SUPPLY APPARATUS, AMPLIFIER APPARATUS, RADIO APPARATUS AND REPRODUCING APPARATUS

(75) Inventors: Hideyuki Funaki, Shinagawa-ku (JP); Kazuhiko Itaya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 11/678,398

(22) Filed: Feb. 23, 2007

(65) Prior Publication Data

US 2008/0012638 A1    Jan. 17, 2008

(30) Foreign Application Priority Data

Jul. 12, 2006    (JP)    ............... 2006-191529

(51) Int. Cl.
*H03F 3/04* (2006.01)
*H03G 3/20* (2006.01)

(52) U.S. Cl. ............................ 330/297; 330/136
(58) Field of Classification Search ......... 330/129–142, 330/278, 297
See application file for complete search history.

(56) References Cited

U.S. PATENT DOCUMENTS 7,395,039 B2    7/2008    Akizuki et al.

2002/0183019 A1*    12/2002    Dent et al. ............ 455/108
2004/0028242 A1    2/2004    Kitamura
2006/0159198 A1*    7/2006    Morimoto et al. ........ 375/297

FOREIGN PATENT DOCUMENTS

| JP | 03-250805 | 11/1991 |
|---|---|---|
| JP | 4-365226 | 12/1992 |
| JP | 8251246 | 9/1996 |
| JP | 2002-223132 | 8/2002 |
| JP | 2004-274831 | 9/2004 |
| JP | 2005-6402 | 1/2005 |
| JP | 2002-135349 | 5/2005 |
| JP | 2005-137172 | 5/2005 |
| JP | 2006-148835 | 6/2006 |

* cited by examiner

*Primary Examiner*—Robert Pascal
*Assistant Examiner*—Khiem D Nguyen
(74) *Attorney, Agent, or Firm*—Oblon, Spivak, McClelland, Maier & Neustadt, P.C.

(57) ABSTRACT

A power supply apparatus which supplies power to an amplifier, includes: a regulator stabilizing a voltage of the power supplied to the amplifier; and a stabilizing controller obtaining an amplitude level of an input signal inputted to the amplifier and controlling a stability of the voltage by the regulator based on the amplitude level.

9 Claims, 4 Drawing Sheets

POWER SUPPLY APPARATUS, AMPLIFIER APPARATUS, RADIO APPARATUS AND REPRODUCING APPARATUS

CROSS-REFERENCE TO RELATED APPLICATIONS

This application is based upon and claims the benefit of priority from the prior Japanese Patent Application No. 2006-191529, filed on Jul. 12, 2006; the entire contents of which are incorporated herein by reference.

BACKGROUND OF THE INVENTION

1. Field of the Invention

The present invention relates to a power supply apparatus, an amplifier apparatus, a radio apparatus and a reproducing apparatus in which a power output is stabilized.

2. Description of the Related Art

In accordance with a low voltage of a system such as electronic products, a power supply with high accuracy used for an analog circuit is expected. In particular, a power supply apparatus free from an influence of a load as much as possible is required when electric power quality such as a voltage variation is directly linked to quality of a circuit output, such as a power amplifier at a final stage in a radio apparatus and an A-class amplifier in a reproducing apparatus.

As a characteristic showing such quality of the power supply apparatus as stated above, there is a Power Supply Rejection Ratio (PSRR). The PSRR is a ratio in which the power supply voltage variation becomes to be an input variation of an amplifier and so on. Generally, in a power supply apparatus such as a switching regulator (for example, refer to JP-A 2005-6402 (KOKAI)), the PSRR is improved by providing a large-capacity bypass capacitor and so on.

However, an addition of a component such as the capacitor may cause a large size of the power supply apparatus. Besides, it is necessary to estimate the load in advance when a capacity of the capacitor and so on are determined, and therefore, it was difficult to stabilize the power supply voltage and to improve the PSRR effectively, when the load varies.

BRIEF SUMMARY OF THE INVENTION

As stated above, in the conventional power supply apparatus, amplifier apparatus, radio apparatus and reproducing apparatus, there are problems that it is difficult to stabilize the power supply voltage when the load varies, and an apparatus becomes large-sized. The present invention is made to solve the problems as stated above, and an object thereof is to provide a power supply apparatus, an amplifier apparatus, a radio apparatus, and a reproducing apparatus capable of controlling a stability of the power supply voltage in accordance with the load.

To attain the above-stated object, a power supply apparatus according to a first aspect of the present invention, which supplies power to an amplifier, including: a regulator stabilizing a voltage of the power supplied to the amplifier; and a stability controller obtaining an amplitude level of an input signal inputted to the amplifier and controlling a stability of the voltage by the regulator based on the amplitude level.

An amplifier apparatus according to a second aspect of the present invention, including: an amplifier amplifying an input signal; a regulator stabilizing a power supply voltage supplied to the amplifier; and a stability controller obtaining an amplitude level of the input signal and controlling a stability of the power supply voltage by the regulator based on the amplitude level A radio apparatus according to a third aspect of the present invention, including: an amplifier amplifying a transmission signal; a regulator stabilizing a power supply voltage supplied to the amplifier; and a stability controller obtaining an amplitude level of the transmission signal and controlling a stability of the power supply voltage by the regulator based on the amplitude level. In addition, a reproducing apparatus according to a fourth aspect of the present invention, including: an amplifier apparatus according to the second aspect of the present invention amplifying a reproducing signal; a regulator stabilizing a power supply voltage supplied to the amplifier apparatus; and a stability controller obtaining an amplitude level of the reproducing signal and controlling a stability of the power supply voltage by the regulator based on the amplitude level.

DETAILED DESCRIPTION OF THE INVENTION

Figure 1:
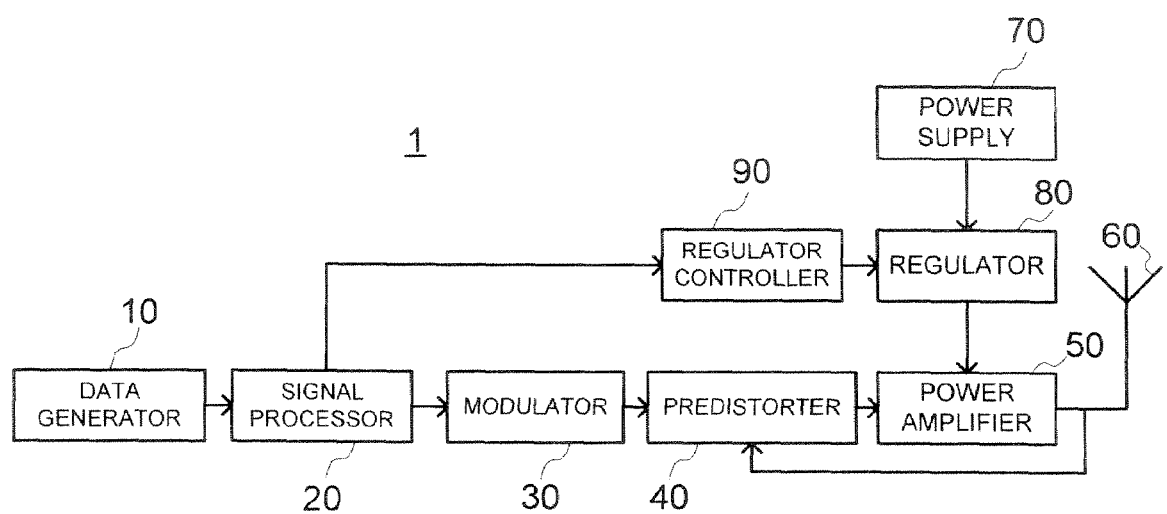
FIG. 1 is a block diagram showing a configuration of a radio apparatus according to an embodiment of the present invention.

Hereinafter, embodiments of the present invention are described in detail with reference to the drawings. FIG. 1 is a block diagram showing a configuration of a radio apparatus of an embodiment according to the present invention. In the radio apparatus of this embodiment, a control of a regulation (a control of a power output) is performed based on an input signal of a power amplifier, for a regulator smoothing power supplied to the power amplifier. As shown in FIG. 1, a radio apparatus 1 of this embodiment includes a data generator 10, a signal processor 20, a modulator 30, a predistorter 40, a power amplifier 50, an antenna 60, a power supply 70, a regulator 80 and a regulator controller 90.

The data generator 10 generates a transmission data transmitted by this radio apparatus 1. Various components can be used for the data generator 10 depending on types of information to be transmitted. For example, when the information to be transmitted is audio, it is constituted by a microphone, an A/D converter, and so on. Besides, when the information to be transmitted is digital data, it is constituted by a computer terminal and so on. The data generator 10 may adopt a mode in which the information to be transmitted is inputted from outside of the radio apparatus 1 as the digital data.

The signal processor 20 performs the signal processes such as a coding process and a multiplexing process for example, to the transmission data generated by the data generator 10. In addition, the signal processor 20 also sends the signal-processed transmission data to the regulator controller 90 as a reference signal for controlling a later-described power supply stabilization quality.

The modulator 30 modulates the transmission data signal processed by the signal processor 20 by a predetermined modulation method. For example, a digital modulation such as an quadrature amplitude modulation method can be used for the modulator 30. A modulated signal outputted from the modulator 30 is inputted to the predistorter 40.

The predistorter 40 is a distortion compensator, which compensates a distortion generated at the power amplifier 50 connected at a subsequent stage thereof. The power amplifier 50 amplifies the modulated signal inputted via the predistorter 40. The predistorter 40 refers to an output signal of the power amplifier 50, and generates a compensation signal having an opposite characteristic to a distortion component generated by the power amplifier 50. Further, the predistorter 40 improves the distortion characteristic of the power amplifier 50 by adding the generated compensation signal to the modulated signal outputted from the modulator 30. A power amplifier having a good linear characteristic capable of corresponding to an amplitude modulation is desirable for the power amplifier 50. The output signal of the power amplifier 50 is transmitted to the antenna 60, and a radio wave is radiated from the antenna 60.

The power supply 70 supplies power to the power amplifier 50. For example, a rechargeable battery (storage battery), a commercial power supply, and so on can be used for the power supply 70. A power supply voltage outputted from the power supply 70 is supplied to the regulator 80.

The regulator 80 is a power supply stabilizer, which rectifies and smooths the voltage supplied from the power supply 70, to supply to the power amplifier 50. The regulator 80 stabilizes the power supply voltage by, for example, a switching regulator method Incidentally, the regulator 80 is able to control a degree of stability of the power output supplied to the power amplifier 50 based on a later-described control signal transmitted from the regulator controller 90.

The regulator controller 90 is a stability controller, which controls the quality of the power supply stabilization at the regulator 80 based on the reference signal sent from the signal processor 20. For example, a voltage variation, a residual ripple, and so on can be cited as the stabilization quality of the power supply. The regulator controller 90 predicts an amplitude component of the modulated signal modulated by the modulator 30, based on the reference signal sent from the signal processor 20. The regulator controller 90 then controls the regulator 80 so that the power supply quality thereof becomes capable of handling the distortion component by predicting a degree of the distortion component generation at the power amplifier 50 from the amplitude component of the modulated signal.

Operations of the radio apparatus 1 shown in FIG. 1 are described. The data generator 10 generates the transmission data, and the signal processor 20 performs the predetermined signal process for the transmission date to input to the modulator 30. The modulator 30 modulates the inputted transmission data by the predetermined modulation method, and inputs this modulated signal to the predistorter 40. The predistorter 40 receiving the modulated signal compensates for the signal to be an opposite characteristic of a non-linear component of the power amplifier 50 to input to the power amplifier 50. The power amplifier 50 amplifies the inputted signal up to a predetermined level to input to the antenna 60, and the antenna 60 radiates the radio wave.

The output signal of the power amplifier 50 is fed back to the predistorter 40. The predistorter 40 determines a compensation characteristic and a compensation amount for the modulated signal to reflect on the compensation process as needed, based on the fed back output signal.

When the power supply voltage is applied from the power supply 70, the regulator 80 supplies it to the power amplifier 50 while performing the rectifying and smoothing processes. Generally, in a power amplifier maintaining a good linear characteristic such as a linear amplifier, the linear characteristic may deteriorate if an input signal having an amplitude exceeding a dynamic range is inputted, or an input signal with a frequency band width exceeding a design value is inputted. Similarly, the linear characteristic may also deteriorate when a load of the power amplifier exceeds the design value. The stabilization quality of the power supplied to the power amplifier is easy to affect good or bad of the linear characteristic, under a condition in which the linear characteristic deteriorates as stated above.

Accordingly, in the power amplifier 50 of the radio apparatus 1 according to this embodiment, a control is performed to improve the power supply stabilization quality of the power amplifier 50 under a condition in which the linear characteristic of the power amplifier 50 deteriorates. Namely, the regulator controller 90 extracts amplitude information corresponding to an amplitude value of the transmission data from the signal processor 20 as the reference signal, and transmits the control signal of the stabilization quality to the regulator 80 based on the amplitude information. For example, when it is shown that the amplitude information from the signal processor 20 exceeds a predetermined amplitude value, the regulator controller 90 transmits the control signal to improve the degree of stability to the regulator 80. The regulator 80 operates to dynamically increase a degree of smoothing based on the control signal as stated above, and to supply a high-quality voltage with less voltage variation and ripples to the power amplifier 50.

The control of the stabilization quality by the regulator 80 can be realized by, for example, controlling a sampling frequency of the switching regulator.

As stated above, according to the radio apparatus, the amplifier apparatus of this embodiment, it is constituted such that the regulator controller refers to the input signal of the power amplifier as the reference signal, and the regulator supplying the power to the power amplifier is controlled based on the reference signal, and therefore, it is possible to control the power supply quality delicately in accordance with the input signal. In addition, the reference signal is referred at a stage before the input signal is inputted to the power amplifier (so-called the feed forward control is performed), and therefore, a generation of distortion at the power amplifier can be suppressed in advance. Incidentally, in the radio apparatus of this embodiment, a frequency converter is omitted, but it is not limited to the above. The frequency converter and a local oscillator converting the modulated signal into a predetermined frequency may be included therein.

Figure 2:
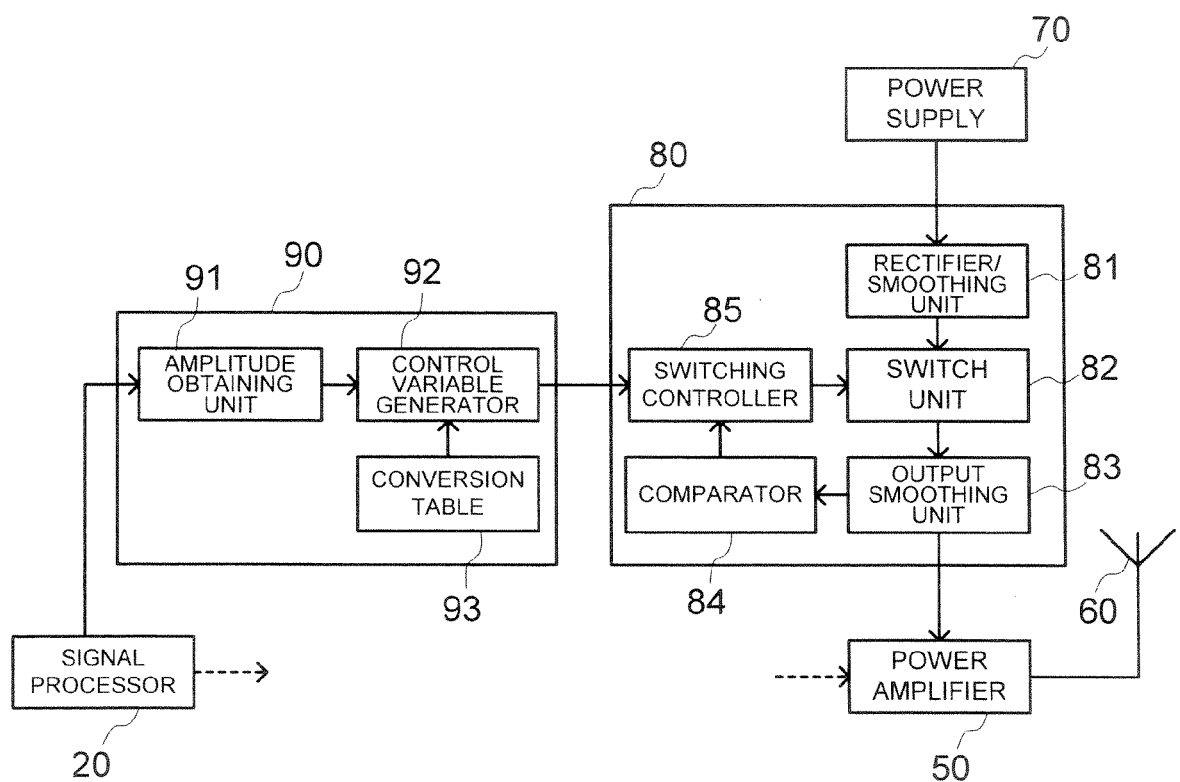
FIG. 2 is a block diagram showing configurations of a regulator and a regulator controller in the radio apparatus of this embodiment.

Subsequently, the regulator 80 and the regulator controller 90 according to the radio apparatus of this embodiment is described in detail with reference to FIG. 2. FIG. 2 is a block diagram showing a configuration of the regulator 80 and the regulator controller 90 according to the radio apparatus 1 of this embodiment.

As shown in FIG. 2, the regulator 80 of this embodiment includes a rectifier/smoothing unit 81, a switch unit 82, an output smoothing unit 83, a comparator 84 and a switching controller 85, to thereby constitute a switching regulator. The regulator controller 90 of this embodiment includes an amplitude obtaining unit 91, a control variable generator 92 and a conversion table 93.

The rectifier/smoothing unit 81 generates a direct-current voltage by rectifying and smoothing the voltage supplied from the power supply 70. The rectifier/smoothing unit 81 converts the inputted voltage into a direct-current voltage by, for example, a full-wave rectifier circuit and so on in which diode devices are combined. Subsequently, the rectifier/smoothing unit 81 smoothes the converted direct-current voltage by a capacitor and so on, and inputs it to the switch unit 82. A double-voltage circuit, a half-wave rectifier circuit, and so on can be used for the rectifier circuit of the rectifier/smoothing unit 81 in addition to the full-wave rectifier circuit. And, a device such as a transistor can be used for the rectifier circuit of the rectifier/smoothing unit 81 in addition to the one in which the capacitor is used. Incidentally, when the power supply 70 supplies the direct-current voltage, the rectifier/smoothing unit 81 can be omitted.

The switch unit 82 stabilizes a voltage by turning ON/OFF the supplied direct-current voltage. The switch unit 82 has a function to stabilize an output voltage by repeating the ON/OFF operation in a predetermined cycle. The direct-current voltage turned ON/OFF at the switch unit 82 is sent to the output smoothing unit 83.

The output smoothing unit 83 smooths the received direct-current voltage. The output smoothing unit 83 operates to smooth the voltage varying by turning ON/OFF a switch at the switch unit 82 and to supply to the power amplifier 50. The output smoothing unit 83 can be realized by, for example, a capacitor, an LC filter, and so on. The output smoothing unit 83 supplies the output to the power amplifier 50 and also inputs the output to the comparator 84 as a reference voltage.

The comparator 84 compares a voltage of a reference voltage source (not-shown) and the reference voltage transmitted from the output smoothing unit 83. Here, the reference voltage source of the comparator 84 may be equipped inside of the regulator 80, but a mode inputting from external can be adopted. The comparator 84 operates to compare whether the output voltage of the regulator 80 is matched with a rated voltage or not.

The switching controller 85 controls the switching operation of the switch unit 82 based on a comparison result by the comparator 84. In accordance with the result of the comparison by the comparator 84, the switching controller 85 controls such that a period when the switch is in an OFF state becomes short within the switching operation when the output voltage of the output smoothing unit 83 is lower than the voltage of the reference voltage source, and controls such that a period when the switch is in the OFF state becomes long when the output voltage of the output smoothing unit 83 is higher.

Specifically, the switching controller 85 generates a pulse signal to provide to the switch unit 82, and the switch unit 82 performs the ON/OFF operation based on the pulse signal. When the output voltage of the output smoothing unit 83 is lower than the voltage of the reference voltage source, the switching controller 85 controls such that, for example, a pulse width making the switch unit 82 perform the ON operation becomes long (PWM method). On the contrary, when the output voltage of the output smoothing unit 83 is higher than the voltage of the reference voltage source, the switching controller 85 controls such that the pulse width making the switch unit 82 perform the OFF operation becomes long. Incidentally, the control of the pulse signal by the switching controller 85 is not limited to the PWM method controlling the pulse width. It may be a PFM method controlling a pulse frequency.

The rectifier/smoothing unit 81, the switch unit 82, the output smoothing unit 83, the comparator 84 and the switching controller 85 composing the regulator 80 are realized by methods and circuits generally used as a switching regulator.

The amplitude obtaining unit 91 receives the reference signal sent from the signal processor 20, and extracts an amplitude component of the transmission data (amplitude component after the transmission data is modulated) to thereby estimate the amplitude value. The amplitude obtaining unit 91 has functions to generate the amplitude value of a modulated wave, based on the transmission data as a digital data, and to send it to the control variable generator 92. More specifically, the amplitude obtaining unit 91 may have a constitution including a modulator which is in a common modulation method with the modulator 30 and a detector envelope-detecting the modulated output to output the amplitude component of the detector output. The amplitude obtaining unit 91 may have a constitution including a table in which a value of output data from the signal processor 20 and an amplitude component of a modulated output when the value of the output data is modulated at the modulator 30 are contrasted in advance, and the amplitude component after the modulation is read to output based on the received transmission data. As stated above, the amplitude obtaining unit 91 may have any constitution as long as the amplitude component of the modulated output can be generated based on the transmission data, and an appropriate constitution can be selected in accordance with a format of the transmission data and/or the modulation method.

The control variable generator 92 generates a control signal of the switching control based on the amplitude value of the received modulated wave. The conversion table 93 is a data storage means in which the amplitude value of the modulated wave and the switching control variable of the switch unit 82 are corresponded. The control variable generator 92 has functions to read the switching control variable corresponding to the received amplitude value from the conversion table 93 and to send the switching control variable to the switching controller 85. Incidentally, this conversion table 93 may be constituted to be rewritable, or equipped at external of this radio apparatus.

Figure 3:
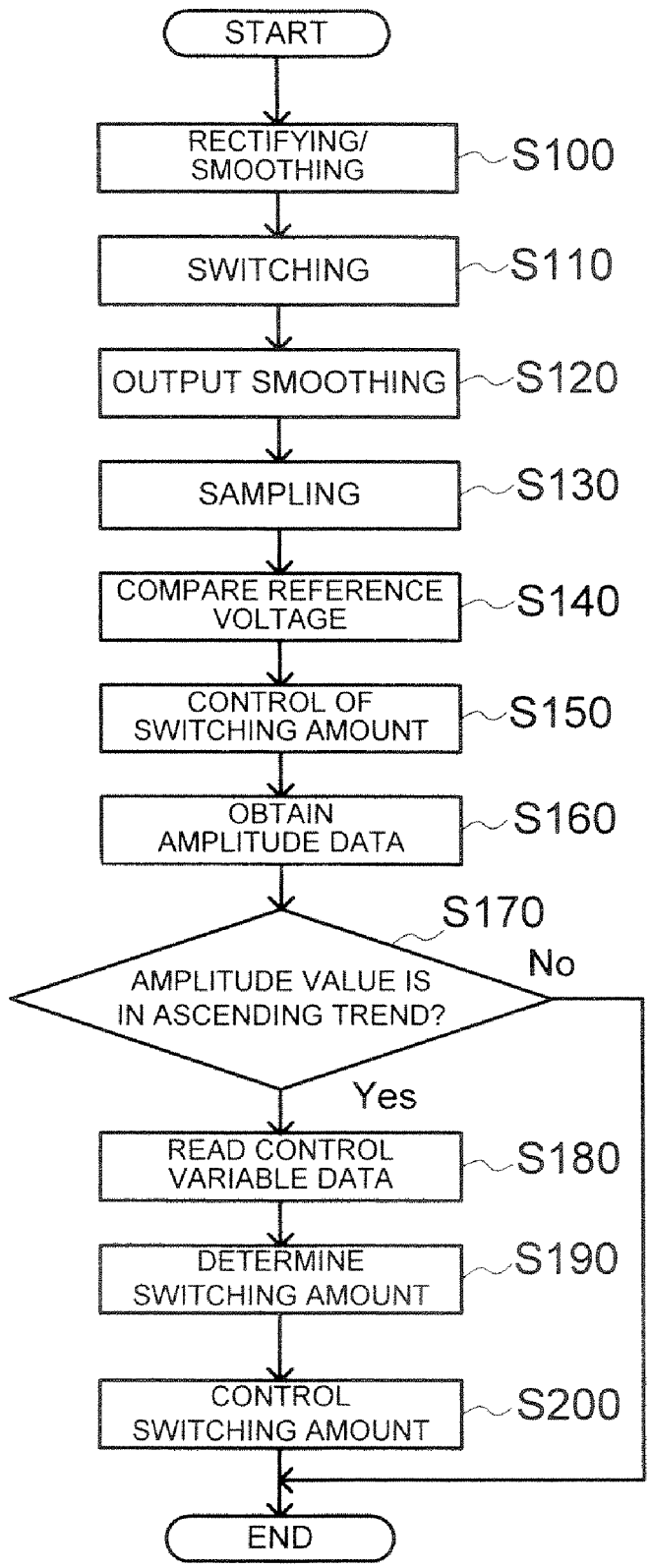
FIG. 3 is a flow chart showing operations of the regulator and the regulator controller in the radio apparatus of this embodiment

Here, operations of the regulator 80 and the regulator controller 90 of the radio apparatus 1 in this embodiment are described with reference to FIG. 2 and FIG. 3. FIG. 3 is a flow chart showing the operations of the regulator and the regulator controller in the radio apparatus of this embodiment. Here, it is described that a predetermined voltage is to be supplied to the power amplifier 50.

The power supply 70 inputs the voltage to be supplied to the power amplifier 50 into the rectifier/smoothing unit 81 of the regulator 80. When the voltage is inputted, the rectifier/smoothing unit 81 generates a predetermined direct-current voltage by rectifying and smoothing the input (step 100: Hereinafter, referred to as "S100"). The direct-current voltage rectified and smoothed is inputted to the switch unit 82.

The switch unit 82 performs a switching of the rectified and smoothed direct-current voltage with a predetermined sampling frequency based on the pulse signal provided from the switching controller 85 (S110). The switch unit 82 generates the direct-current voltage with a predetermined voltage by this switching operation, to input to the output smoothing unit 83.

The output smoothing unit 83 makes the smoothing of the inputted direct-current voltage again (S120). The smoothed direct-current voltage is supplied to the power amplifier 50 as the power for amplification. In addition, the output smoothing unit 83 also inputs the obtained direct-current voltage to the comparator 84 as the reference voltage (S130).

The comparator 84 compares the voltage of the reference voltage source (not-shown) and the reference voltage, and sends the comparison result to the switching controller 85 (S140).

The switching controller 85 constantly provides the pulse signal with the predetermined sampling frequency to the switch unit 82. The switching controller 85 controls the ON/OFF timing of the switch unit 82 based on the comparison result sent from the comparator 84. This control may be realized by controlling the pulse width, or may be realized by controlling the frequency directly. It may be realized by controlling a duty cycle of the pulse signal. For example, in an example controlling the pulse width, it is controlled so as to widen the pulse width which makes the switch in ON state when the reference voltage is lower than the voltage of the reference voltage source. In an example controlling the frequency, it is controlled so as to increase the frequency of the pulse signal when the reference voltage is lower than the voltage of the reference voltage source. Herewith, the switching amount at the switch unit 82 is controlled (S150).

Here, the amplitude obtaining unit 91 constantly refers to the amplitude information of the modulated wave inputted from the signal processor 20 to the power amplifier 50, and sends it to the control variable generator 92 (S160).

The control variable generator 92 refers to the sent amplitude information, and observes whether the amplitude of the modulated wave inputted to the power amplifier 50 (or an average value thereof and so on) is in an ascending trend or in a descending trend (S170).

When the amplitude value is in the ascending trend ("Yes" in S170), the load of the power amplifier 50 becomes heavy, and a possibility to deviate from a good linear region among the amplitude characteristic becomes high. Therefore, the control variable generator 92 reads the switching control variable information corresponding to the sent amplitude information from the conversion table 93 (S180) to input to the switching controller 85.

The switching controller 85 determines the sampling frequency of the pulse signal based on the switching control variable information sent from the control variable generator 92 (S190), to input to the switch unit 82 (S200). In this case, the distortion at the power amplifier 50 tends to increase, and therefore, for example, the frequency of the pulse signal is controlled to increase. Herewith, the switching operation at the switch unit 82 is speeding up, and it becomes possible to perform the power supply stabilization operation of the regulator 80 more delicately.

On the other hand, when the amplitude value is in the descendent trend ("No" in S170), it can be expected that the power amplifier 50 performs a rated operation (normal operation). Accordingly, any additional control is not performed for the regulator 80. Herewith, it becomes possible to suppress an increase of power consumption by suppressing an operating frequency of the regulator 80 at the time of the rated operation.

Incidentally, in the radio apparatus of this embodiment, the additional control is not performed for the regulator 80 when the amplitude value is in the descending trend, but it is not limited to this. Namely, it may be constituted such that three patterns are defined in the conversion table 93 for cases when the amplitude value is the rated value, when it is in the ascending trend, and when it is in the descending trend, and the control variable generator 92 instructs the switching controller 85 to lower the frequency of the pulse signal when the amplitude value is in the descending trend. It becomes possible to further eliminate the power consumption by positively suppressing the switching operation of the switch unit 82 when the load of the power amplifier 50 is light, by taking the constitution as stated above.

Figure 4:
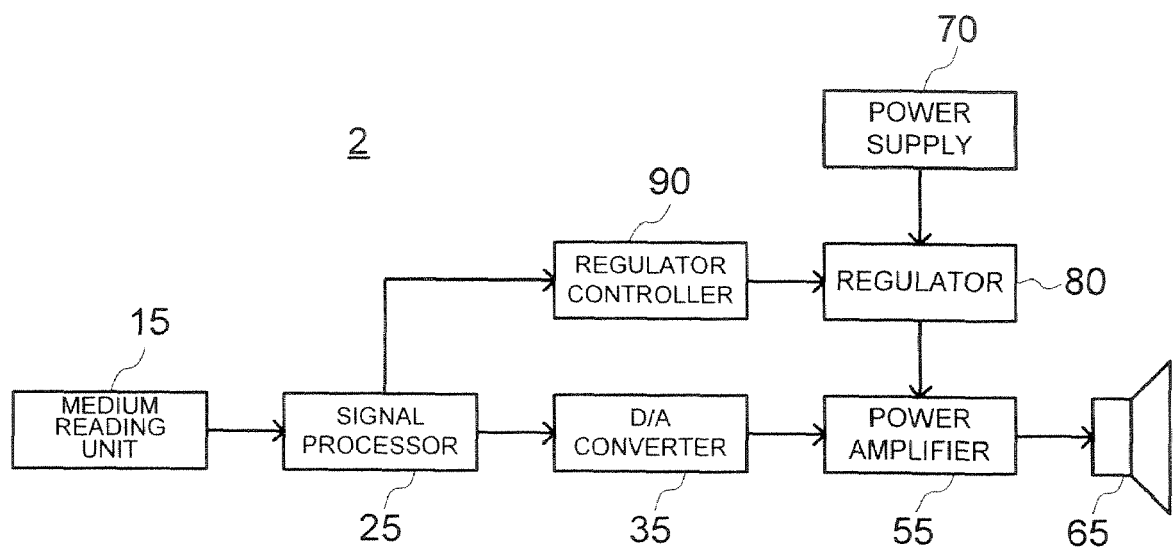
FIG. 4 is a block diagram showing a configuration of a reproducing apparatus according to another embodiment of the present invention.

Subsequently, another embodiment of the present invention is described in detail with reference to FIG. 4. FIG. 4 is a block diagram showing a configuration of a reproducing apparatus according to another embodiment. As shown in FIG. 4, the reproducing apparatus of this embodiment is the one in which the power supply 70, the regulator 80 and the regulator controller 90 among the radio apparatus 1 of the embodiment shown in FIG. 1 are applied to an audio amplifier.

A reproducing apparatus 2 of this embodiment includes a medium reading unit 15, a signal processor 25, a D/A converter 35, a power amplifier 55, a speaker 65, the power supply 70, the regulator 80 and the regulator controller 90.

The medium reading unit 15 reads reproducing information from a storage medium storing music information and so on. As the storage medium from which the reproducing information is read out, for example, the one in which analog reproducing information is stored as a digital signal such as a CD, a DVD, and an MO can be used. The medium reading unit 15 operates to read the reproducing information from the storage medium to send to the signal processor 25.

The signal processor 25 performs a signal process required for a reproduction of the received digital reproducing information. The signal processor 25 has functions, for example, to convert the reproducing information into reproducible data, and to expand compressed data. The signal processor 25 performs a predetermined signal process to the received reproducing information, and sends it to the D/A converter 35. In addition, the signal processor 25 also has a function to send the reproducing information to the regulator controller 90 as reference information.

The D/A converter 35 converts the digital reproducing information into analog reproducing information. The D/A converter 35 receives the digital reproducing information from the signal processor 25, and converts into an analog signal, to input to the power amplifier 55.

The power amplifier 55 is a linear amplifier power-amplifying the analog reproducing information up to a predetermined level. An amplifier having a good linearity is used for the power amplifier 55 to amplitude the analog reproducing information (audio information). The power amplifier 55 amplifies the received analog reproducing information up to the predetermined level, and outputs it to the speaker 65. The speaker 65 outputs the inputted reproducing information as sound.

Incidentally, internal configurations of the power supply 70, the regulator 80 and the regulator controller 90 are the same as those in the radio apparatus of the embodiment shown in FIG. 1 and FIG. 2, and therefore, the redundant description is not given.

Operations of the reproducing apparatus 2 shown in FIG. 4 are described. The medium reading unit 15 reads the reproducing information, and then, the signal processor 25 performs the predetermined signal process for the reproducing information, to input to the D/A converter 35. The D/A converter 35 converts the inputted reproducing information into the analog reproducing information, to input to the power amplifier 55. The power amplifier 55 amplifies the analog reproducing information up to the predetermined level, to output to the speaker 65.

Operations of the power supply 70, the regulator 80 and the regulator controller 90 are the same as in the radio apparatus of the embodiment shown in FIG. 1 and FIG. 2. When the power supply voltage is applied from the power supply 70, the regulator 80 performs the rectifying and smoothing processes to supply to the power amplifier 55. In this embodiment, a control to improve the power supply stabilization quality of the power amplifier 55 is also achieved under a condition in which the linear characteristic of the power amplifier 55 deteriorates. Namely, the regulator controller 90 extracts the amplitude information corresponding to the amplitude value of the reproducing information from the signal processor 25 as the reference signal, and transmits the control signal for stabilization quality to the regulator 80 based on the amplitude information. For example, when the amplitude information from the signal processor 25 shows that it exceeds the predetermined amplitude value, the regulator controller 90 transmits the control signal to the regulator 80 so as to improve the degree of stability. The regulator 80 operates so as to dynamically increase the degree of smoothing to thereby input a high quality voltage with less voltage variation and ripples to the power amplifier 55 based on the control signal as stated above.

The control of the stabilization quality by the regulator 80 can be realized by, for example, controlling the sampling frequency of the switching regulator.

As stated above, according to the reproducing apparatus and the power amplifier of this embodiment, it is constituted such that the regulator controller refers to the input signal of the power amplifier as the reference signal, and controls the regulator supplying the power to the power amplifier based on the reference signal, and therefore, the power quality can be controlled delicately in accordance with the input signal. And, the reference signal is referred at the stage before the input signal is inputted to the power amplifier, and therefore, the generation of the distortion at the power amplifier can be suppressed in advance.

Incidentally, the present invention is not limited only to the above-stated embodiments. In the above-stated embodiments, the control of the regulation is performed by referring to the signal in a digital phase, but it is not limited to this. Namely, the reference signal may be captured from any position as long as the amplitude information can be obtained from a stage before the signal is inputted to the power amplifier. The reference signal is not limited to a digital signal, but it may be an analog signal. Further, the control of the regulation is performed based on the amplitude information in the above-stated embodiments, but it is not limited to this, and the similar effect can be obtained by using other parameters capable of deteriorating the linear characteristic of the amplifier such as a frequency band width.

According to the embodiments as stated above, it is possible to stabilize power supplied to an amplifier even when a load of the amplifier varies.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power supply apparatus which supplies power to an amplifier, comprising:
    a regulator to stabilize a voltage of the power supplied to the amplifier, the regulator including a switching regulator to stabilize the voltage by turning ON/OFF the power based on a predetermined pulse signal; and
    a stability controller to obtain an amplitude level of an input signal inputted to the amplifier, and control a stability of the voltage by said regulator based on the amplitude level, the stability controller including:
    an amplitude obtaining unit to obtain amplitude value information from the input signal of the amplifier;
    a conversion table to store the amplitude value information and frequency information of the pulse signal corresponding to the amplitude value information; and
    a control variable generator to read the corresponding frequency information from the conversion table based on the amplitude value information obtained by the amplitude obtaining unit, and to control the frequency of the pulse signal based on the read frequency information.

2. The apparatus according to claim 1, wherein said stability controller extracts amplitude information from a digital input signal to obtain the amplitude level.

3. The apparatus according to claim 1, wherein said regulator comprises a switching regulator stabilizing the voltage by turning ON/OFF the power based on a predetermined pulse signal, and wherein said stability controller controls a frequency of the pulse signal based on the amplitude level.

4. An amplifier apparatus, comprising:
    an amplifier to amplify an input signal;
    a regulator to stabilize a power supply voltage supplied to said amplifier, the regulator including a switching regulator to stabilize the voltage by turning ON/OFF the power based on a predetermined pulse signal; and
    a stability controller to obtain an amplitude level of the input signal and control a stability of the power supply voltage by said regulator based on the amplitude level the stability controller including:
    an amplitude obtaining unit to obtain amplitude value information from the input signal of the amplifier;
    a conversion table to store the amplitude value information and frequency information of the pulse signal corresponding to the amplitude value information; and
    a control variable generator to read the corresponding frequency information from the conversion table based on the amplitude value information obtained by the amplitude obtaining unit, and to control the frequency of the pulse signal based on the read frequency information.

5. The apparatus according to claim 4, wherein said stability controller extracts the amplitude information from a digital input signal to obtain the amplitude level.

6. The apparatus according to claim 4, wherein said regulator comprises a switching regulator stabilizing the voltage by turning ON/OFF the power based on a predetermined pulse signal, and wherein said stability controller controls a frequency of the pulse signal based on the amplitude level.

7. A radio apparatus, comprising:
    an amplifier to amplify a transmission signal;
    a regulator to stabilize a power supply voltage supplied to said amplifier, the regulator including a switching regulator to stabilize the voltage by turning ON/OFF the power based on a predetermined pulse signal; and
    a stability controller to obtain an amplitude level of the transmission signal and control a stability of the power supply voltage by said regulator based on the amplitude level the stability controller including:
    an amplitude obtaining unit to obtain amplitude value information from the input signal of the amplifier;
    a conversion table to store the amplitude value information and frequency information of the pulse signal corresponding to the amplitude value information; and a control variable generator to read the corresponding frequency information from the conversion table based on the amplitude value information obtained by the amplitude obtaining unit, and to control the frequency of the pulse signal based on the read frequency information.

8. The apparatus according to claim 7,
wherein said stability controller obtains the amplitude level by extracting amplitude information from a digital input signal.

9. The apparatus according to claim 7,
wherein said regulator comprises a switching regulator stabilizing the voltage by turning ON/OFF the power based on a predetermined pulse signal, and
wherein said stability controller controls a frequency of the pulse signal based on the amplitude level.

\* \* \* \* \*